United States Patent

Suzuki et al.

(10) Patent No.: US 9,799,608 B2
(45) Date of Patent: Oct. 24, 2017

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Takuma Suzuki, Himeji Hyogo (JP); Hirofumi Fujisawa, Himeji Hyogo (JP); Tsutomu Shirakawa, Ibo Hyogo (JP); Kenya Sano, Himeji Hyogo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/840,850

(22) Filed: Aug. 31, 2015

(65) Prior Publication Data

US 2016/0268212 A1  Sep. 15, 2016

(30) Foreign Application Priority Data

Mar. 11, 2015  (JP) .................. 2015-048889

(51) Int. Cl.
*H01L 23/544* (2006.01)
*H01L 29/872* (2006.01)
*H01L 29/16* (2006.01)

(52) U.S. Cl.
CPC ........ *H01L 23/544* (2013.01); *H01L 29/1608* (2013.01); *H01L 29/872* (2013.01); *H01L 2223/54406* (2013.01); *H01L 2223/54433* (2013.01); *H01L 2223/54473* (2013.01)

(58) Field of Classification Search
CPC . H01L 23/544; H01L 29/1608; H01L 29/872; H01L 2223/54406; H01L 2223/54433; H01L 2223/54473
See application file for complete search history.

(56) References Cited

U.S. PATENT DOCUMENTS

| 6,261,919 B1 | 7/2001 | Omizo | |
|---|---|---|---|
| 2013/0176701 A1* | 7/2013 | Toda | ............... H05K 1/188 361/762 |
| 2014/0017447 A1* | 1/2014 | Kondo | ............... H01L 23/544 428/141 |
| 2016/0172306 A1* | 6/2016 | Scanlan | ............... H01L 23/544 438/462 |

FOREIGN PATENT DOCUMENTS

| JP | 2009-266862 A | 11/2009 |
|---|---|---|
| JP | 2010-067815 A | 3/2010 |
| JP | 2010-283070 A | 12/2010 |
| JP | 2012-028664 A | 2/2012 |
| TW | 454238 | 9/2001 |
| TW | 2004-16826 | 9/2004 |
| TW | 2009-19596 | 5/2009 |
| TW | 2010-21955 | 6/2010 |

OTHER PUBLICATIONS

Taiwanese Office Action dated Oct. 4. 2016, filed in Taiwanese counterpart Patent Application No. 104129061, 6 pages (with English translation).

* cited by examiner

*Primary Examiner* — Whitney T Moore
(74) *Attorney, Agent, or Firm* — Patterson & Sheridan, LLP

(57) ABSTRACT

A semiconductor device includes a monocrystalline substrate of a material which does not have a liquid phase at atmospheric pressure, and an identification mark disposed on or in the substrate comprising an amorphous region of the material or a region of the material deviated from stoichiometry.

8 Claims, 4 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-048889, filed Mar. 11, 2015, the entire contents of which are incorporated herein by reference.

FIELD

Embodiments described herein relate generally to a semiconductor device and a method for manufacturing the same.

BACKGROUND

An identification mark (traceable ID) is placed on a semiconductor chip in order to retrospectively check the manufacturing and use history information and the like of the semiconductor chip. For example, the identification mark is carved into the chip with laser light at a location other than the element region of the semiconductor chip. However, debris or dust that occurs when the identification mark is formed with laser light, is scattered onto the element region, and this may be a cause of device failure of the semiconductor chip.

DETAILED DESCRIPTION

In general, according to one embodiment, a semiconductor device includes a monocrystalline substrate that is formed of a material which does not have a liquid phase at atmospheric pressure, such as silicon carbide, and an identification mark on or in the substrate formed as an amorphous region of the substrate material or a region of the substrate material deviated from stoichiometry of the substrate material.

Embodiments will be described hereinafter with reference to the drawings. Corresponding elements and the like are given the same reference signs in the following description. Descriptions of elements and the like that are described once will not be repeated where appropriate.

First Embodiment

A semiconductor device according to the present embodiment is provided with a monocrystalline substrate and an identification mark. The substrate is formed of a material that does not have a liquid phase at a normal pressure. The identification mark is disposed on the substrate and is an amorphous region of the material and/or a region of the material deviated from stoichiometry.

Figure 1A:
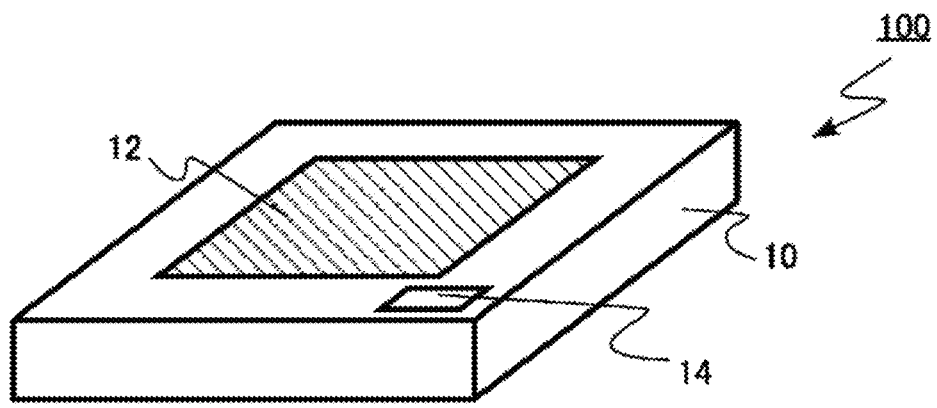
FIGS. 1A to 1C are schematic diagrams of a semiconductor device according to a first embodiment.
Figure 1B:
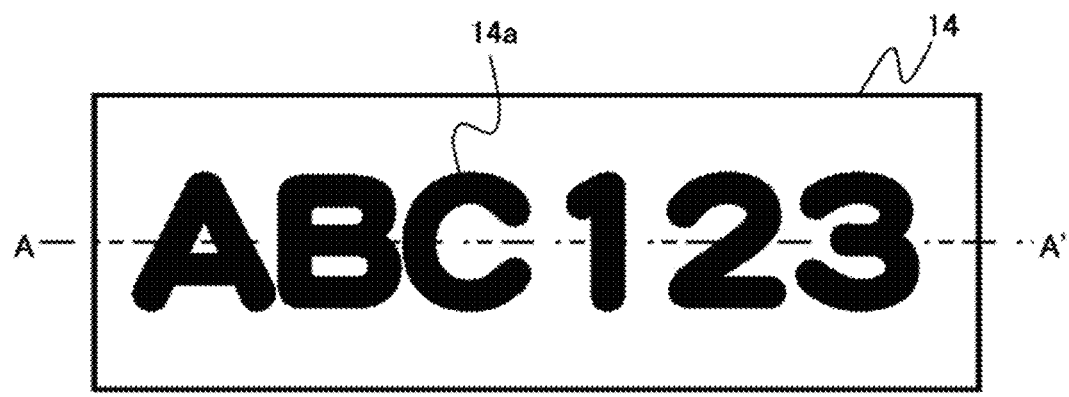
Figure 1C:
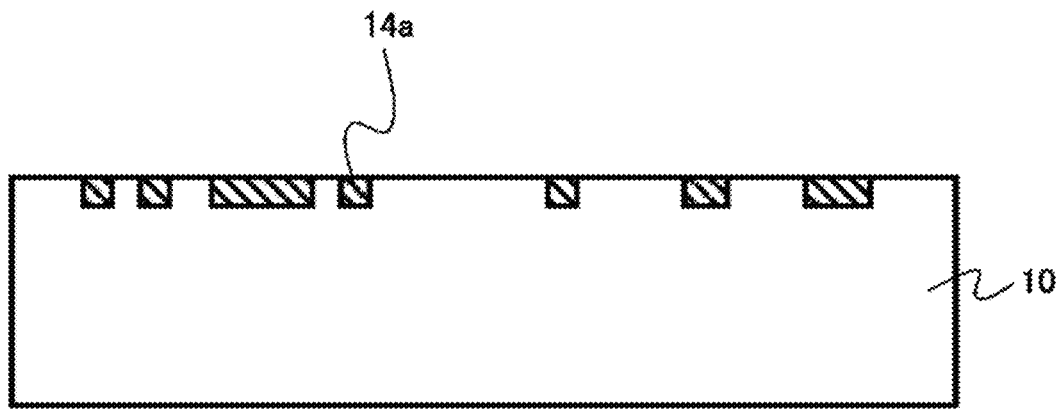

FIGS. 1A to 1C are schematic diagrams of the semiconductor device according to the present embodiment. FIG. 1A is a perspective view of the semiconductor device according to the present embodiment. FIG. 1B is a top view of the identification mark according to the present embodiment. FIG. 1C is a cross-sectional view of the identification mark in the present embodiment. FIG. 1C is a cross-sectional view taken along the line AA' in FIG. 1B. The semiconductor device according to the present embodiment is a Schottky barrier diode (SBD) in which a SiC substrate is used.

A Schottky barrier diode (SBD) 100 is provided with a semiconductor substrate (substrate) 10, an anode electrode 12, a cathode electrode (not illustrated), and an identification mark 14. The SBD 100 is a diced semiconductor chip.

The semiconductor substrate 10 is a monocrystalline substrate formed of a material which does not have a liquid phase at atmospheric pressure. The material of the semiconductor substrate 10 is, for example, silicon carbide (SiC). In addition to SiC, examples of a material that does not have a liquid phase at atmospheric pressure include gallium nitride (GaN), diamond, and sapphire.

The semiconductor substrate 10 has a front surface, a rear surface, and side surfaces. The anode electrode 12 is disposed on the front surface of the semiconductor substrate 10. The cathode electrode (not shown) is disposed on the rear surface of the semiconductor substrate 10. An element region is formed between the anode electrode 12 and the cathode electrode of the semiconductor substrate 10.

The identification mark 14 is disposed in a region other than the element region on the surface of the semiconductor substrate 10. The identification mark 14 has a region 14a as illustrated in FIG. 1B and FIG. 1C. A character string, for example, is formed as the identification mark in the region 14a. A one-dimensional or two-dimensional barcode may also be formed as the identification mark in the region 14a.

The region 14a is, for example, amorphous SiC. The region 14a is, for example, an amorphized region of the monocrystalline SiC comprising the substrate.

Alternatively, the region 14a is, for example, SiC comprising the substrate that is deviated from stoichiometry. The region 14a is, for example, a region in which the composition of SiC is modulated. For example, the silicon/carbon composition ratio of SiC (Si/C composition ratio) is less than one in the region.

Diffuse reflection occurs in the region 14a because the region 14a is amorphous or is deviated from stoichiometry. Therefore, better optical visibility is obtained for the identification mark 14.

The maximum height (Rz) of the surface of the identification mark 14 is less than or equal to 100 nm. The maximum height (Rz) of the surface of the identification mark 14 is desirably 50 nm or less.

The maximum height (Rz) is the sum of the maximum peak height and the maximum valley depth of a roughness curve. In other words, the maximum height (Rz) is the maximum difference in between the peaks and valleys of the surface roughness. In the present disclosure, the maximum height (Rz) is measured in nanometers (nm).

A method for manufacturing the SBD 100 according to the present embodiment includes forming an identification mark as an amorphous portion of a substrate, or by modulating the composition of a substrate, by irradiating the monocrystalline substrate that is formed of a material which does not have a liquid phase at a normal pressure with laser light that has greater energy than the band gap of the material.

First, the element region of the SBD 100 is manufactured through a known manufacturing method. Then, the identification mark 14 is formed on the surface of the semiconductor substrate 10.

The identification mark 14 is formed by irradiating the surface of the semiconductor substrate 10 with laser light that has greater energy than the band gap of the material of the semiconductor substrate 10. The region 14a is formed as a portion of the semiconductor substrate 10 that is converted to an amorphous state by laser light irradiation or as a portion of the substrate in which the composition is modulated by laser light irradiation.

The laser light is desirably a pulsed laser. The laser light is desirably a femtosecond laser.

Irradiating the semiconductor substrate 10 with laser light that has greater energy than the band gap of the semiconductor substrate 10 directly cleaves intermolecular bonds in the semiconductor substrate 10 and enables amorphization or composition modulation thereof. The energy of the laser light may be specified by the wavelength of the laser light.

The fourth harmonic generation (FHG) of a YAG laser, for example, is used as the laser light when the semiconductor substrate 10 is formed of SiC. The FHG of a YAG laser has a wavelength of 266 nm and has energy of 4.66 eV. Since the band gap of SiC is 3.26 eV, the energy of the laser light is greater than the band gap energy of SiC.

Next, the method and the effect of the present embodiment will be described.

Examples of a method for forming the identification mark on the surface of the substrate by using laser light include a method of forming roughness by scraping the surface of the substrate through abrasion and the like. This method is called hard marking. In hard marking, debris or dust caused by a sublimate is scattered on the element region when roughness is formed. Thus, device failure such as a short in wiring may be caused.

In order to prevent debris or dust from occurring, there is used a method of forming roughness by controlling conditions for the laser light irradiation and melting only the surface of the substrate when, for example, the substrate is formed of silicon. This method is called soft marking. Soft marking is preferred as a method for forming the identification mark on the semiconductor chip because debris or dust does not occur.

Melting the surface of the substrate, however, is not possible when the substrate is formed of a material such as SiC that does not have a liquid phase under a normal pressure. Thus, soft marking cannot be performed.

In the present embodiment, the region 14a comprising the identification mark, i.e., numerals, letters or symbols used to identify the chip, is formed in a manner of either amorphizing the semiconductor substrate 10 or modulating the composition of the semiconductor substrate 10 by controlling conditions for the laser light irradiation. Thus, the laser light irradiation does not sublime the semiconductor substrate 10 in the region 14a, and this suppresses occurrence of debris or dust. Therefore, occurrence of device failure caused by formation of the identification mark 14 is suppressed.

The identification mark 14 in the present embodiment may be identified by an X-ray by using the fact that the region 14a is amorphous or is deviated from stoichiometry as compared to the surrounding region of the substrate. Therefore, the information contained in or as the identification mark 14 may be read in a non-destructive manner by using an X-ray inspection device even, for example, after the SBD 100 is covered with a molding resin.

Figure 2:
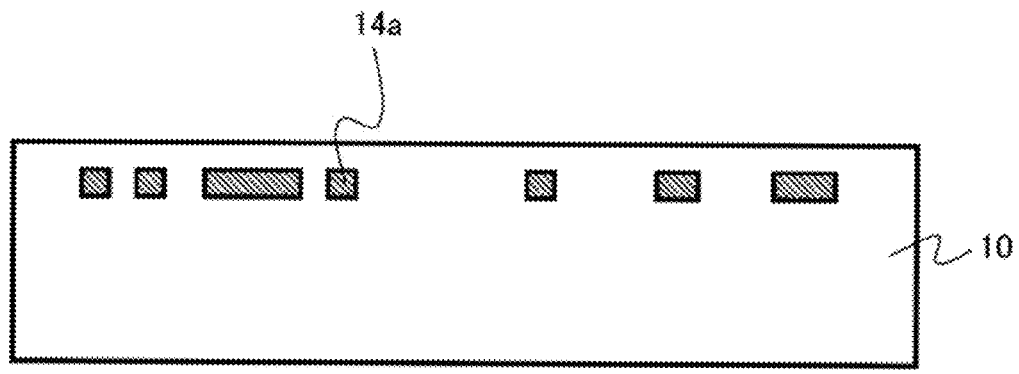
FIG. 2 is a cross-sectional view of an identification mark according to a modification example of the first embodiment.

FIG. 2 is a cross-sectional view of an identification mark according to a modification example of the present embodiment. The difference from the previous embodiment is that the region 14a is formed within the stoichiometric single crystal semiconductor substrate 10. The region 14a in the present modification example may be formed by, for example, setting the focal point of the laser light to be deeper than the surface of the semiconductor substrate 10 and amorphizing or modulating the substrate material within the substrate to form the identification mark.

The region 14a formed in the semiconductor substrate 10 is visible because a SiC substrate, a GaN substrate, a diamond substrate, and a sapphire substrate are transparent. According to the present modification example, debris or dust separated from the surface of the semiconductor substrate 10 during the step of amorphizing or modulating the semiconductor substrate to create the identification mark is further suppressed. Therefore, occurrence of device failure accompanied by formation of the identification mark 14 is further suppressed.

According to the present embodiment so far, a semiconductor device that enables reduction of device failure caused by formation of an identification mark and a method for manufacturing the semiconductor device are achieved. In addition, a semiconductor device provided with an identification mark, the information of which may be read in a non-destructive manner even after the semiconductor device is covered with a molding resin and a method for manufacturing the semiconductor device, is achieved.

Second Embodiment

A semiconductor device according to the present embodiment is similar to the one in the first embodiment except that an identification mark is disposed on the side surface of the substrate. Therefore, a duplicate description of the same contents as those in the first embodiment will be omitted.

Figure 3A:
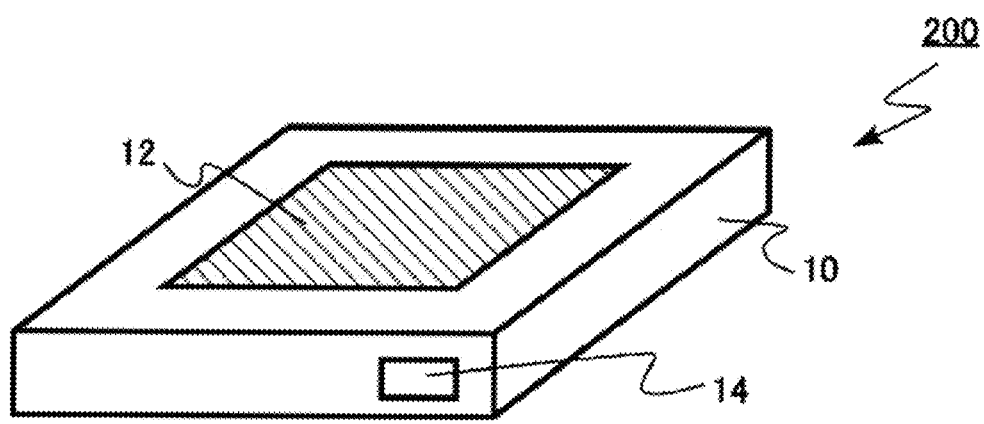
FIGS. 3A and 3B are schematic diagrams of a semiconductor device according to a second embodiment.
Figure 3B:
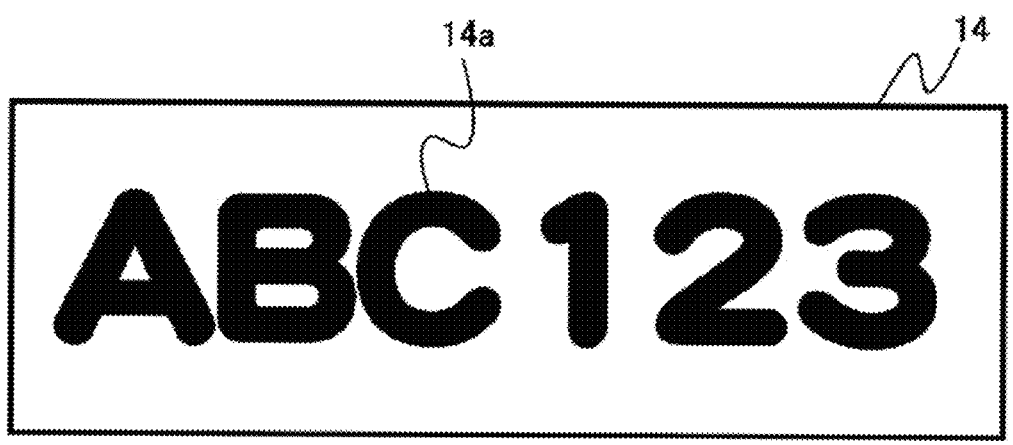

FIGS. 3A and 3B are schematic diagrams of a semiconductor device according to the present embodiment. FIG. 3A is a perspective view of the semiconductor device according to the present embodiment. FIG. 3B is a top view of an identification mark according to the present embodiment. The semiconductor device according to the present embodiment is a Schottky barrier diode (SBD) in which a SiC substrate is used.

An SBD 200 is provided with the semiconductor substrate (substrate) 10, the anode electrode 12, the cathode electrode (not illustrated), and the identification mark 14. The SBD 200 is a diced semiconductor chip.

The semiconductor substrate 10 has a front surface, a rear surface, and side surfaces. The anode electrode 12 is disposed on the surface of the semiconductor substrate 10. The cathode electrode is disposed on the rear surface of the semiconductor substrate 10. An element region is formed between the anode electrode 12 and the cathode electrode of the semiconductor substrate 10.

The identification mark 14 is disposed on the side surface of the semiconductor substrate 10. Disposing the identification mark 14 on the side surface of the semiconductor substrate 10 leaves additional space on the surface of the semiconductor substrate 10 where the identification mark would otherwise be located. Therefore, the proportion of the element region occupying the surface of the semiconductor substrate 10 may be increased. Accordingly, the size of the SBD 200 may be miniaturized where the SBD is not increased in size.

According to the present embodiment, a semiconductor device that may be miniaturized may be achieved in addition to the effect of the first embodiment.

Hereinafter, an embodiment will be described.

Embodiment

The surface of a SiC substrate is irradiated with laser light to either amorphize the SiC substrate or modulate the composition of the SiC substrate, and an identification mark is thereby formed as the amorphous or modulated material. The fourth harmonic generation (FHG) of a pulsed YAG laser is used as the laser light. The wavelength of the FHG of the YAG laser is 266 nm.

Comparative Example

The surface of a SiC substrate is irradiated with laser light, and roughness is formed on the surface of the SiC substrate to form an identification mark. The energy of the laser light per pulse is set to be higher than that in the embodiment, and is generally high enough to cause the substrate material to sublime. Other conditions except the energy per pulse are the same as in the embodiment.

Figure 4A:
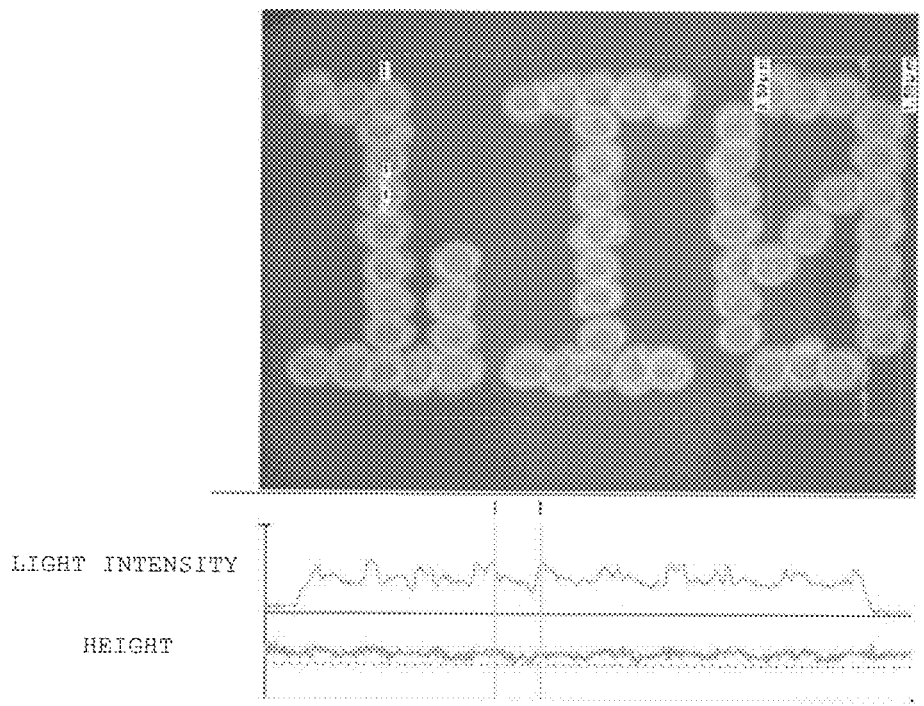
FIGS. 4A and 4B are diagrams illustrating observation results from an embodiment and a comparative example.
Figure 4B:
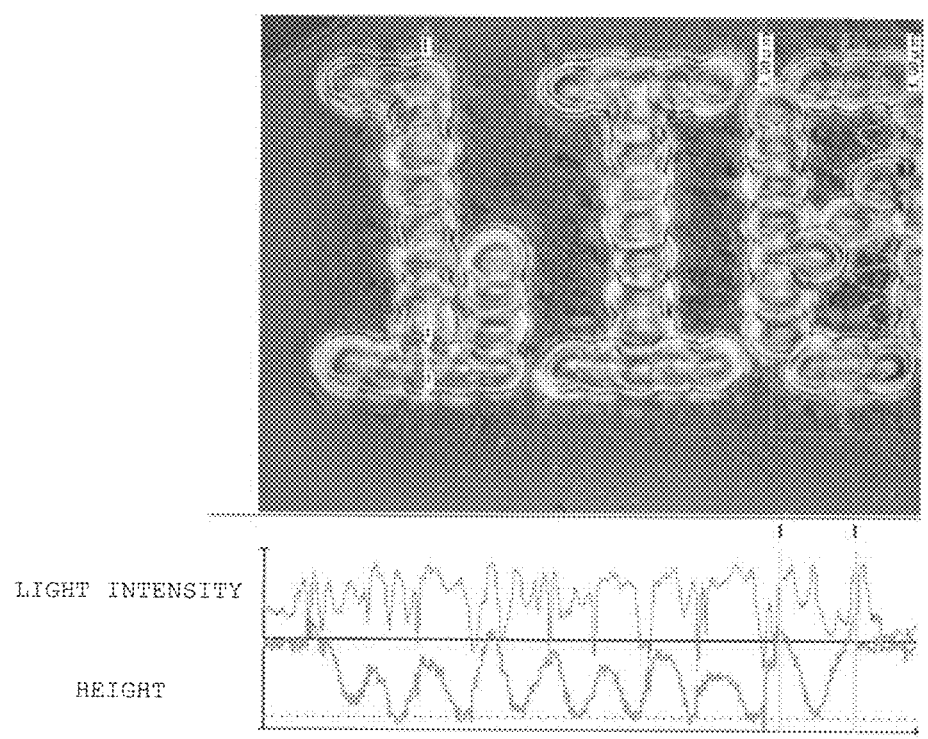

FIGS. 4A and 4B are diagrams illustrating observation results of the identification marks formed as in the embodiment and in the comparative example by using a 3D measuring laser microscope. FIG. 4A is a result from the embodiment, and FIG. 4B is a result from the comparative example. A photograph of the identification mark, the light intensity distribution of the identification mark, and the surface height distribution of the identification mark are illustrated in each of FIG. 4A and FIG. 4B.

As a condition for the embodiment, the maximum height (Rz) of the surface of the identification mark is 100 nm or less. The maximum height (Rz) of the surface of the identification mark is 1 µm or more in the comparative example.

Figure 5:
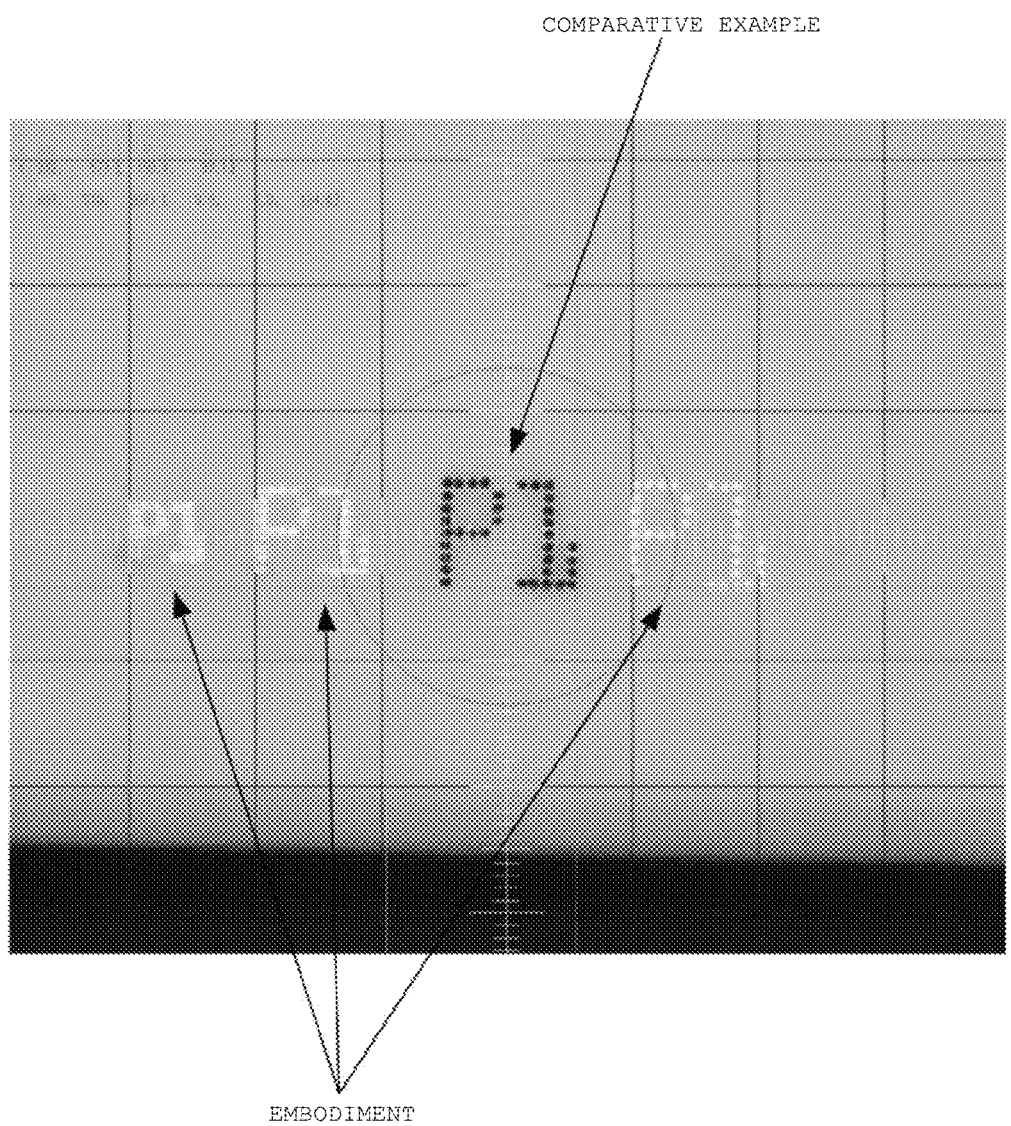
FIG. 5 is a photograph of the identification marks according to the embodiment and the comparative example.

FIG. 5 is a visible light photograph of the identification mark in the embodiment and the comparative example. Optical visibility is sufficiently obtained under the condition of the embodiment.

While an SBD is described as an example in the first and the second embodiments, the embodiments may also be applied to other devices such as a PIN diode, a metal-insulator-semiconductor field-effect transistor (MISFET), and an insulated-gate bipolar transistor (IGBT).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:
   providing a monocrystalline substrate of a material which does not have a liquid phase at atmospheric pressure; and
   forming an identification mark without subliming the material and modifying the material of the substrate by irradiating the monocrystalline substrate with laser light that has energy greater than the band gap of the material to produce at least one of an amorphous region of the material of the monocrystalline substrate and a region of the material of the monocrystalline substrate deviated from stoichiometry.

2. The method according to claim 1, wherein the material is SiC.

3. The method according to claim 1, wherein a maximum height (Rz) of a surface of the identification mark is 100 nm or less.

4. The method according to claim 1, wherein the identification mark is formed on an outer surface of the substrate.

5. The method according to claim 1, wherein the identification mark is formed inwardly of a surface of the substrate.

6. The method according to claim 5, wherein the identification mark is visible from the exterior of the substrate.

7. The method according to claim 1, further comprising;
   encapsulating the substrate in a sealing resin; and
   reading the identification mark by x-ray inspection.

8. The method according to claim 1, wherein the laser light is pulsed.

* * * * *